United States Patent
Lv et al.

(10) Patent No.: US 8,365,390 B2
(45) Date of Patent: Feb. 5, 2013

(54) METHOD FOR AFFIXING ADHESIVE FILMS AND MAIN BOARD WITH ADHESIVE FILMS APPLIED USING THE METHOD

(75) Inventors: Hua-Lin Lv, Shenzhen (CN); Kok-Kan Chan, Santa Clara, CA (US); Ting-Jian Zou, Shenzhen (CN); Yu Zou, Shenzhen (CN); Kai-Gui Wang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 231 days.

(21) Appl. No.: 12/843,073

(22) Filed: Jul. 26, 2010

(65) Prior Publication Data
US 2011/0261552 A1 Oct. 27, 2011

(30) Foreign Application Priority Data
Apr. 22, 2010 (CN) .......................... 2010 1 0152638

(51) Int. Cl.
*G01R 3/00* (2006.01)
(52) U.S. Cl. ........... 29/595; 29/402.02; 29/432; 29/469; 29/592.1; 29/835; 83/29; 83/35; 83/36; 83/50; 361/818
(58) Field of Classification Search ............... 29/835, 29/894.353, 402.02, 432, 469; 83/29, 35, 83/36, 50; 361/818
See application file for complete search history.

(56) References Cited

U.S. PATENT DOCUMENTS
2006/0251844 A1* 11/2006 Choi et al. .................. 428/40.1
* cited by examiner

*Primary Examiner* — Paul D Kim
(74) *Attorney, Agent, or Firm* — Altis Law Group, Inc.

(57) ABSTRACT

A method for affixing adhesive films to a main board is provided. The main board includes a main body and a shield. The shield includes a first shield and a second shield. The second shield defines openings. When the second shield is attached to the main body, components of the main body are confined within the openings, respectively. The method includes: first absorbing a single adhesive film to an electrostatic absorbing film. Then, stamping the electrostatic absorbing film and the single adhesive film to form adhesive films that have substantially the same shape and arrangement as the openings. Next, aligning the electrostatic absorbing film with the first shield and affixing the adhesive films to the first shield. Then, removing the electrostatic absorbing film from the first shield. And, assembling the first shield to the second shield.

4 Claims, 3 Drawing Sheets

METHOD FOR AFFIXING ADHESIVE FILMS AND MAIN BOARD WITH ADHESIVE FILMS APPLIED USING THE METHOD

BACKGROUND

1. Technical Field

The present disclosure relates to adhesive films and, particularly, to a method for affixing adhesive films to a main board.

2. Description of Related Art

A shield is usually used to protect a computer main board against static electricity and electromagnetic interference (EMI). Generally, the shield includes a first shield and a second shield stacked on each other. The second shield is fixed to the main board. To prevent the first shield from contacting the components of the main board, a layer of film is usually affixed to the main board. A method for efficiently affixing the film is thus desirable.

BRIEF DESCRIPTION OF THE DRAWINGS

The components of the drawings are not necessarily drawn to scale, the emphasis instead being placed upon clearly illustrating the principles of present disclosure. Moreover, in the drawings, like reference numerals designate corresponding parts throughout several views.

DETAILED DESCRIPTION

Figure 1:
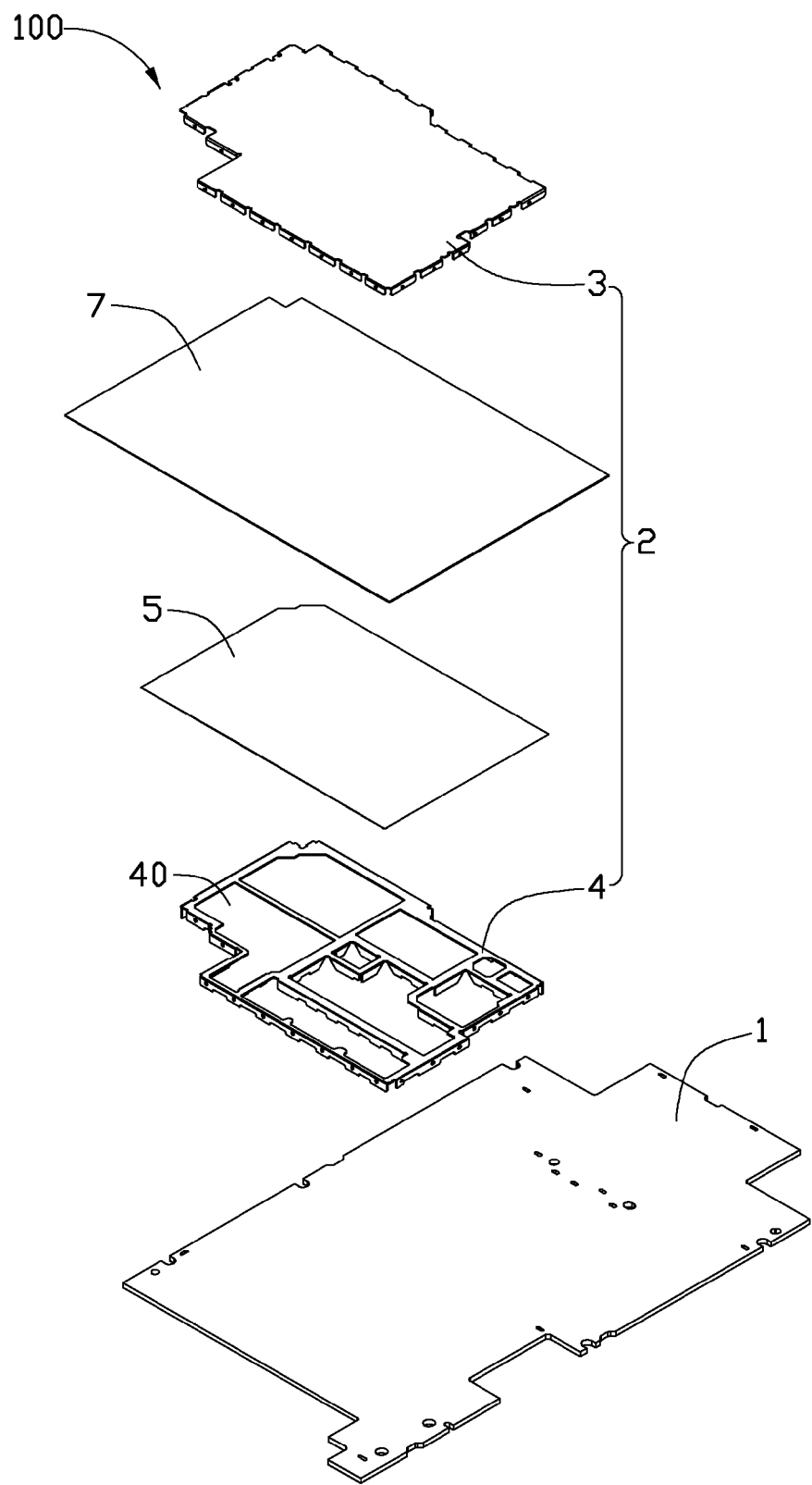
FIG. 1 is an exploded isometric view of a main board in accordance with an exemplary embodiment, showing a first state of the main board.
Figure 2:
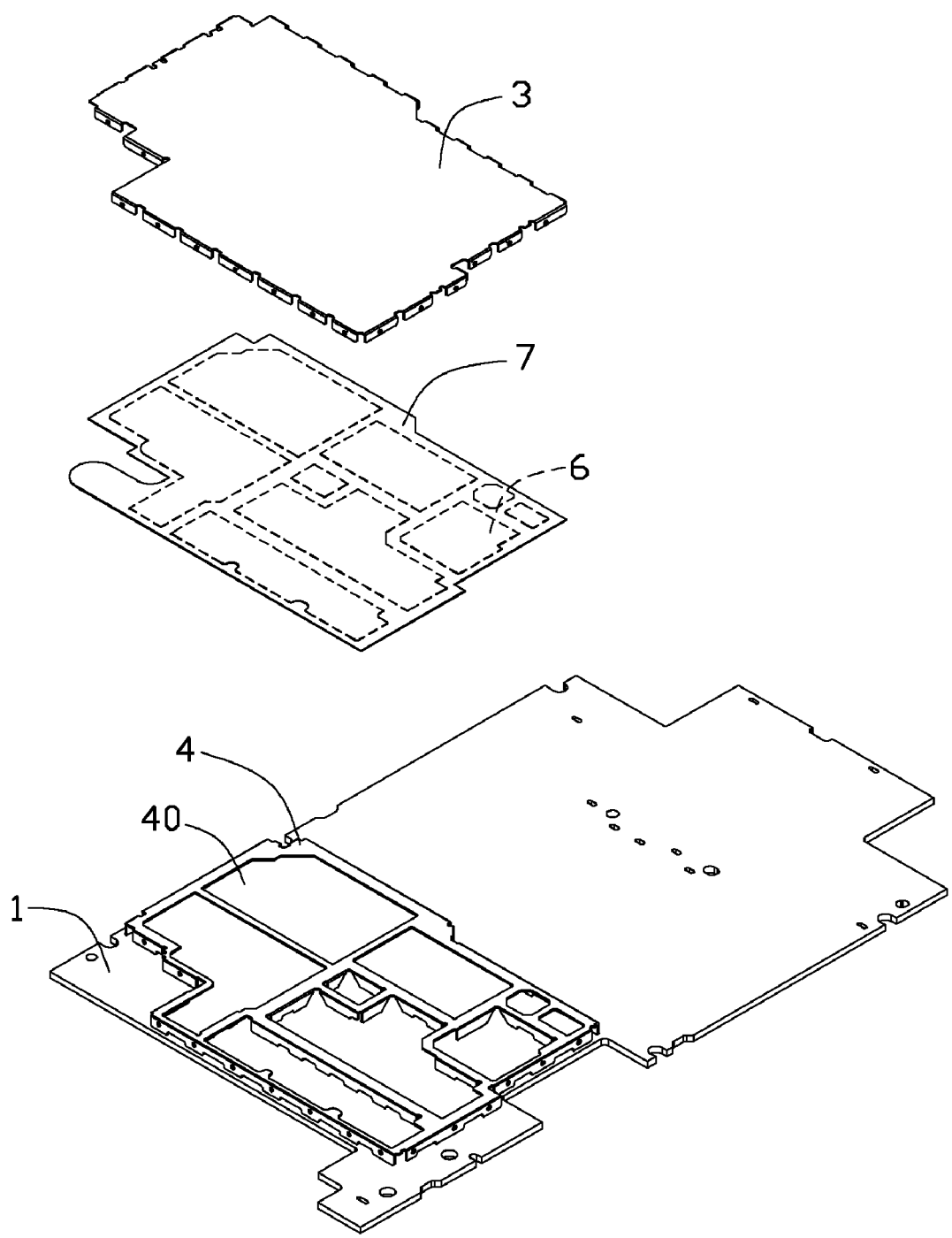
FIG. 2 is similar to FIG. 1, showing a second state of the main board.

Referring to FIGS. 1-2, a main board 100 is shown. The main board 100 includes a main body 1 and a shield 2. The shield 2 includes a first shield 3 and a second shield 4 to protect against electromagnetic interference (EMI). In the embodiment, the second shield 4 is a frame defining a plurality of openings 40. After the second shield 4 is attached to the main body 1, corresponding components of the main body 1 are confined within the respective openings 40.

In the embodiment, to prevent the first shield 3 from contacting/damaging the components on the main body 1, a plurality of insulating, single-sided adhesive films 6 matching the respective openings 40 is provided. The adhesive films 6 are affixed to the first shield 3 in such a way that the arrangement of the adhesive films 6 is substantially the same as the openings 40, preventing the first shield 3 from contacting/damaging the components within the openings 40.

Figure 3:
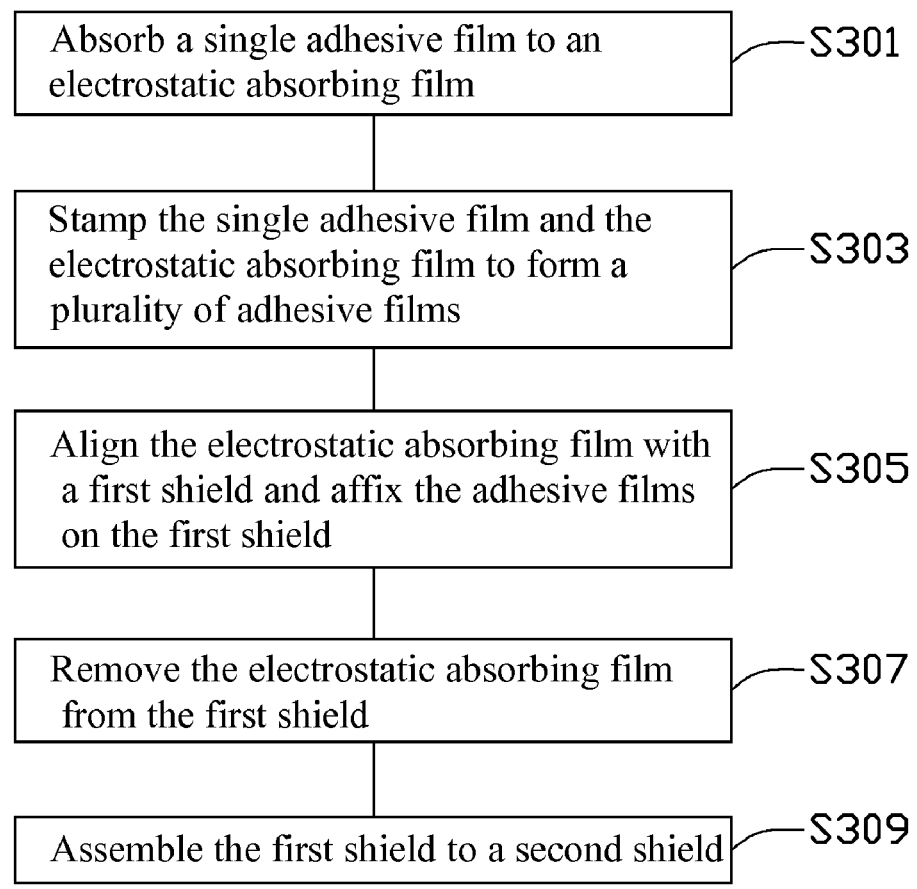
FIG. 3 is a flowchart of a method for affixing the adhesive films in accordance with an exemplary embodiment.

Referring to FIG. 3, a flowchart of a method for affixing adhesive films 6 is provided. In step S301, a single adhesive film 5 is provided and one side of the adhesive film 5 having no adhesive is stuck to an electrostatic absorbing film 7, such as a PET film. The non-adhesive side of the film 5 adheres to the PET film 7 because of the adherent nature of the surface of PET films.

In step S303, stamping the single adhesive film 5 and the electrostatic absorbing film 7 to form the adhesive films 6 on the electrostatic absorbing film 7. The machine (not shown) for the stamping has sufficient precision to cut the single adhesive film 5 into the plurality of adhesive films 6, with the electrostatic absorbing film 7 under the single adhesive film 5 left undamaged. After stamping, the electrostatic absorbing film 7 has substantially the same shape as the first shield 3. The arrangement and the shape of the adhesive films 6 are substantially the same as that of the openings 40 of the second shield 4.

In step S305, aligning the electrostatic absorbing film 7 with the first shield 3 and affixing the adhesive films 6 on the bottom of the first shield 3.

In step S307, removing the electrostatic absorbing film 7 from the first shield 3.

In step S309, assembling the first shield 3 to the second shield 4.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A method for affixing a plurality of adhesive films to a main board, the main board comprising a main body and a shield, the shield comprising a first shield and a second shield, the second shield defining a plurality of openings, when the second shield being attached to the main body, components of the main body being confined within the openings, respectively, the method comprising:
   sticking a single adhesive film to an electrostatic absorbing film;
   stamping the electrostatic absorbing film and the single adhesive film stuck to the electrostatic absorbing film multiple times to form a single stamped electrostatic absorbing film including a plurality of stamped adhesive films still stuck on the single stamped electrostatic absorbing film, wherein the plurality of stamped adhesive films have substantially the same shape and arrangement as the plurality of openings;
   aligning the single electrostatic absorbing film including the plurality of stamped adhesive films with the first shield and affixing the plurality of adhesive films to the first shield;
   removing the stamped electrostatic absorbing film from the plurality of stamped adhesive films affixed to the first shield; and
   assembling the first shield to the second shield.

2. The method for affixing a plurality of adhesive films as described in claim 1, wherein a shape of the stamped electrostatic absorbing film is substantially the same as the first shield.

3. The method for affixing a plurality of adhesive films as described in claim 1, wherein the electrostatic absorbing film is a PET release film.

4. The method for affixing a plurality of adhesive films as described in claim 1, wherein the adhesive films are made of insulating material.

* * * * *